United States Patent
Ishi et al.

(10) Patent No.: US 8,120,151 B2
(45) Date of Patent: Feb. 21, 2012

(54) OPTICAL SEMICONDUCTOR DEVICE AND METHOD FOR MANUFACTURING THE SAME

(75) Inventors: Kazuhisa Ishi, Tokyo (JP); Takaaki Fujii, Tokyo (JP); Hiroaki Okuma, Tokyo (JP); Aki Hiramoto, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 731 days.

(21) Appl. No.: 12/105,420

(22) Filed: Apr. 18, 2008

(65) Prior Publication Data

US 2009/0321774 A1    Dec. 31, 2009

(30) Foreign Application Priority Data

Apr. 19, 2007 (JP) ................... 2007-110057

(51) Int. Cl.
  *H01L 33/00* (2010.01)
(52) U.S. Cl. ............. 257/676; 257/99; 257/E33.056; 257/E23.004; 257/E23.031; 257/E23.043; 257/E23.059; 257/66; 257/677; 257/E21.499; 438/26
(58) Field of Classification Search ........... 257/99, 257/E33.056, E21.499, 666, 667, 670, 677, 257/678, 675, E23.031, E23.059; 438/26
See application file for complete search history.

(56) References Cited

U.S. PATENT DOCUMENTS

| 7,419,312 | B2 * | 9/2008 | Nagasaka | 385/92 |
| 2004/0165840 | A1 * | 8/2004 | Kato et al. | 385/92 |
| 2004/0245528 | A1 * | 12/2004 | Hiramoto | 257/79 |
| 2007/0262409 | A1 * | 11/2007 | Nozaki et al. | 257/487 |

FOREIGN PATENT DOCUMENTS

JP    2004363454    12/2004

* cited by examiner

*Primary Examiner* — Marc Armand
(74) *Attorney, Agent, or Firm* — Kenealy Vaidya LLP (57) ABSTRACT

An optical semiconductor device can have a first lead for an optical semiconductor chip to be mounted on and a second lead for joining to a wire extending from the optical semiconductor chip. The device can be configured to be capable of reducing the possibility of a break of the wire even under a thermal shock and the like. The optical semiconductor device can include a first lead for an optical semiconductor chip to be mounted on, a second lead for joining to a wire (for example, gold wire) extending from the optical semiconductor chip mounted on the first lead; a holder part for supporting the first lead and the second lead at two locations each; a lens part; and a light-transmitting sealing part. The second lead can be separated into two lead pieces with a predetermined gap ($\neq 0$) therebetween as seen in a plan view, or with certain bend configurations as shown in side views, within the inside space of the holder part by which the second lead is supported at two locations.

4 Claims, 11 Drawing Sheets

Section B-B   Section C-C

Section A-A

Cut in two positions

Section B-B  Section C-C

Fig. 11D

Section A-A

Section B-B   Section C-C

Fig. 13D

Section A-A

Fig. 14

OPTICAL SEMICONDUCTOR DEVICE AND METHOD FOR MANUFACTURING THE SAME

This application claims the priority benefit under 35 U.S.C. §119 of Japanese Patent Application No. 2007-110057 filed on Apr. 19, 2007, which is hereby incorporated in its entirety by reference.

BACKGROUND

1. Technical Field

The presently disclosed subject matter relates to an optical semiconductor device such as a light emitting diode and a photodiode, and a method for manufacturing the same.

2. Description of the Related Art

Figures 1A, 1B, 1C:
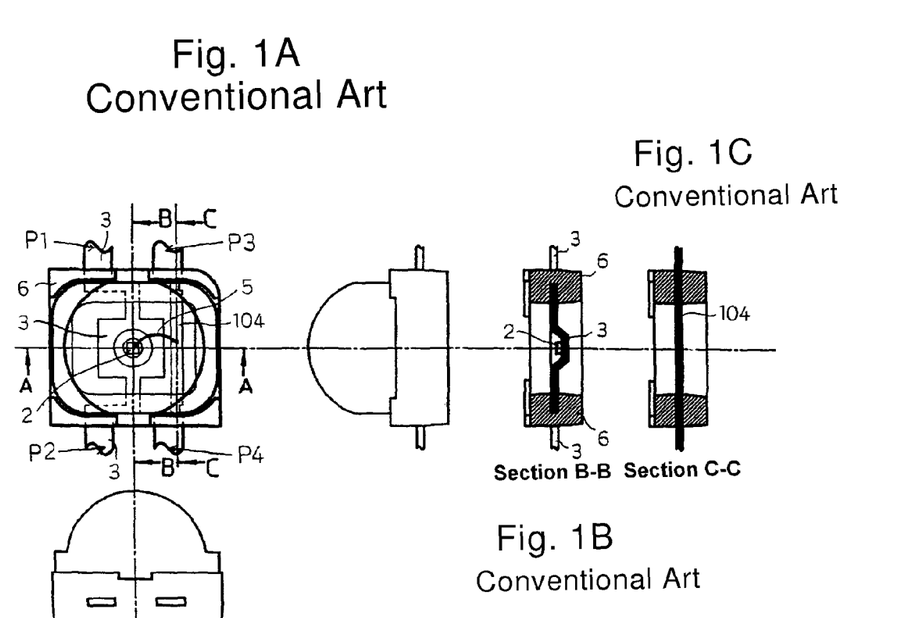
FIGS. 1A, 1B, 1C, and 1D are views showing an example of the configuration of a conventional, typical optical semiconductor device, FIG. 1A being a trihedral top, front and side drawing of the optical semiconductor device, FIG. 1B being a sectional view taken along line A-A of FIG. 1A, FIG. 1C being a sectional view taken along line B-B of FIG. 1A, and FIG. 1D being a sectional view taken along line C-C of FIG. 1A.
Figure 1D:
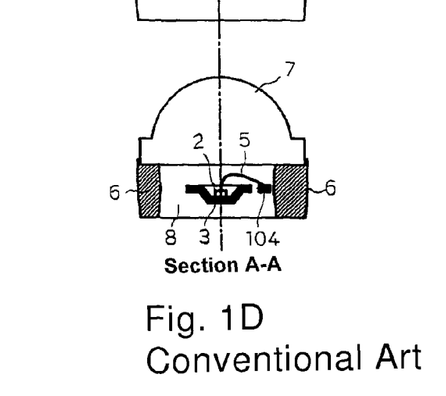

Conventionally, optical semiconductor devices such as described in Japanese Patent Application Laid-Open No. 2004-363454 have been known. FIGS. 1A, 1B, 1C, and 1D are views showing an example of the configuration of a conventional, typical optical semiconductor device. FIG. 1A is a trihedral drawing of the optical semiconductor device. FIG. 1B is a sectional view taken along line A-A of FIG. 1A. FIG. 1C is a sectional view taken along line B-B of FIG. 1A. FIG. 1D is a sectional view taken along line C-C of FIG. 1A.

With reference to FIGS. 1A, 1B, 1C, and 1D, this optical semiconductor device (for example, light emitting diode) is configured to include: an optical semiconductor chip 2 (such as an LED chip); a first lead 3; a second lead 104; a holder part 6 (also called a lamp house, a base part, a cover, etc.); a lens part 7; and a light-transmitting sealing material 8 (such as a light-transmitting soft sealing resin). The optical semiconductor chip 2 is mounted on the first lead 3. A wire 5 extends from the optical semiconductor chip 2 mounted on the first lead 3 and is connected (joined) to a second lead 104. The holder part 6 supports the first lead 3 and the second lead 104 at two locations, respectively. In this instance, a specific example of the wire 5 is a gold wire.

The first lead 3 has two terminals P1 and P2 which protrude outside and can be fixed by solder. The second lead 104 also has two terminals P3 and P4 which protrude outside and can be fixed by solder.

The holder part 6 has no bottom portion at its center area, or has a so-called frame shape. Namely, the holder part 6 has a space penetrating inside thereof. As a result, the first lead 3 and the second lead 104 are in contact with and supported by the holder part 6 only at two locations each (they penetrate the holder part 6). More specifically, since the holder part 6 has no bottom face thereinside, the first lead 3 and the second lead 104 are not in contact with the holder part 6 but are free in the inside space thereof (i.e., within an aperture framed by the holder part 6).

Now, when such an optical semiconductor device as shown in FIGS. 1A to 1D undergoes a thermal shock (i.e., a sudden temperature change from high to low temperature or a sudden temperature change from low to high temperature), the second lead 104 is likely to warp vertically, which may cause the wire 5 to break.

The reason for this is that the second lead 104 in the optical semiconductor device shown in FIGS. 1A to 1D is a single solid member. When the device is mounted on a mounting board, the two terminals P3 and P4 are fixed by solder or the like. Then, the second lead 104 warps vertically within the inside space of the holder part 6 with thermal expansion and/or thermal contraction of the mounting board when undergoing a thermal shock.

Figure 2:
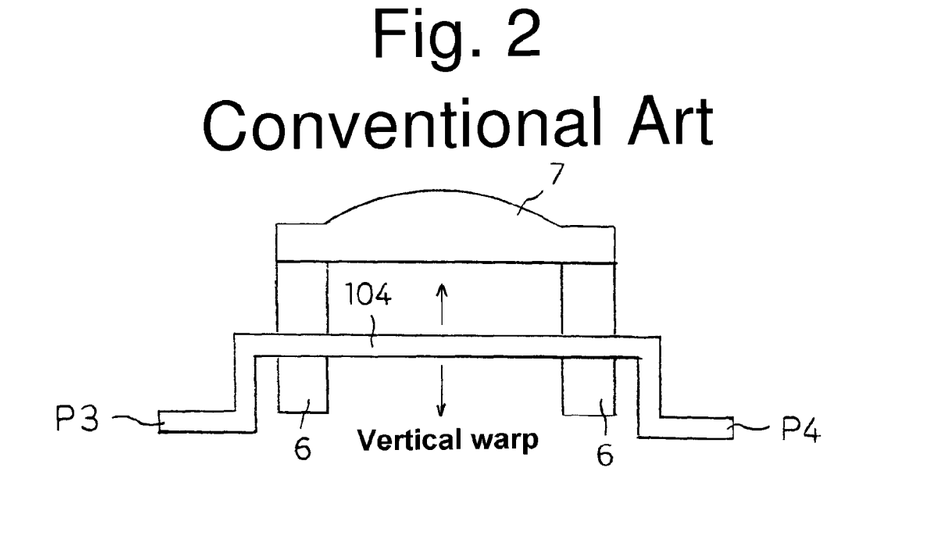
FIG. 2 is a diagram for explaining the mechanism of a wire break in the conventional optical semiconductor device.
Figure 3:
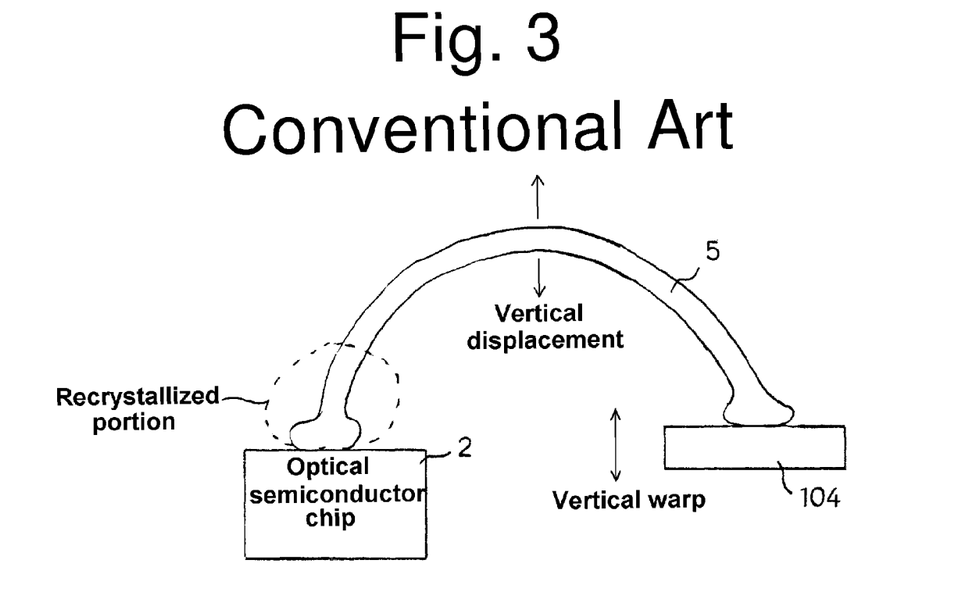
FIG. 3 is a diagram for explaining the mechanism of a wire break in the conventional optical semiconductor device.
Figure 4:
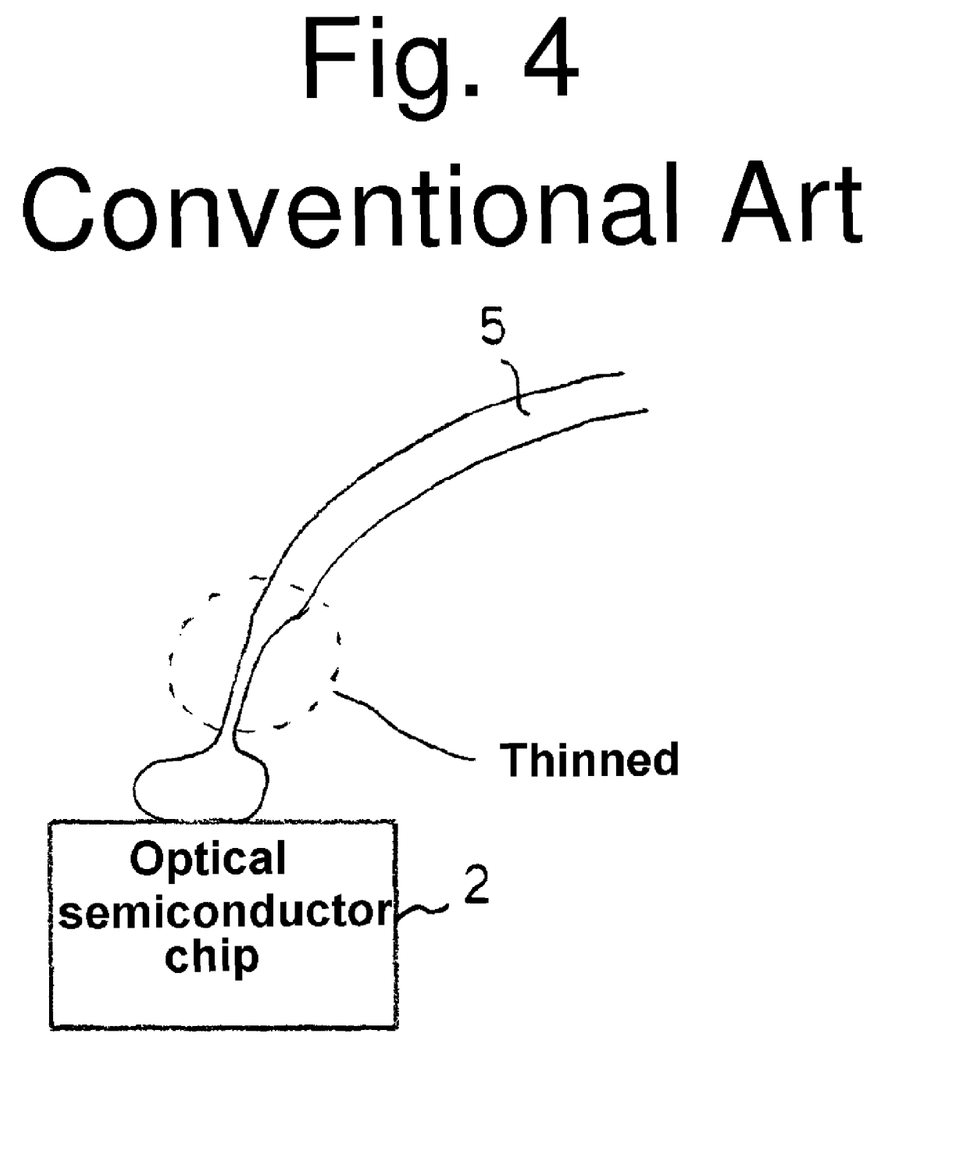
FIG. 4 is a diagram for explaining the mechanism of a wire break in the conventional optical semiconductor device.

FIGS. 2 to 4 are diagrams for explaining the above described situation. When the second lead 104 warps vertically under a thermal shock as shown in FIG. 2, the wire (gold wire) 5 joined to the second lead 104 is also displaced vertically as shown in FIG. 3. The weakest portion of the wire 5 that is joined to the optical semiconductor chip 2 and the second lead 104 is the junction with the optical semiconductor chip 2. To be more specific, the junction with the optical semiconductor chip 2 is formed by recrystallizing the gold wire, followed by thermal and ultrasonic welding. This recrystallized portion has mechanical properties that are weaker than those of non-recrystallized portions. When the wire 5 is vertically displaced, the resulting vertical force therefore acts to stretch the recrystallized portion, whereby the recrystallized portion is thinned as shown in FIG. 4 with an increase in the possibility of a break of the wire 5.

SUMMARY

According to one aspect of the presently disclosed subject matter, an optical semiconductor device can have a first lead for mounting an optical semiconductor chip thereon and a second lead for mounting a wire that extends from the optical semiconductor chip thereon. The device can be configured to be capable of reducing the possibility of a break of the wire even under a thermal shock and the like, and an aspect of the disclosed subject matter also includes a method for manufacturing the same.

According to another aspect of the presently disclosed subject matter, an optical semiconductor device can include: an optical semiconductor chip; a wire extending from the optical semiconductor chip; a holder part having an inside space for accommodating the optical semiconductor chip; a first lead having a mount part for the optical semiconductor chip to be mounted on, being led out of two sides of the holder part including a first side and a second side opposite from the first side; a second lead having a junction with the wire being extended from the optical semiconductor chip, being led out of the first side of the holder part at a location different from where the first lead is led out; and a third lead led out of the second side of the holder part at a location different from where the first lead is led out.

The above optical semiconductor device can further include a sealing part for covering the first lead, the second lead, the third lead, and the optical semiconductor chip within the inside space of the holder part.

In the above optical semiconductor device, one of ends of the third lead may be arranged to be opposed to one of the ends of the second lead that is positioned within the inside space of the holder part.

In the above optical semiconductor device, at least either one of the one end of the second lead and the one end of the third lead, lying within the inside space of the holder part, can have a bent shape.

In the above optical semiconductor device, the bent shape may be composed of two bends and an end parallel to the direction of extension of the first lead.

In the above optical semiconductor device, the first lead, the second lead, and the third lead may be extended from the holder part so as to be in parallel with each other.

In the above optical semiconductor device, a recrystallized portion can be formed in at least either one of the junction between the optical semiconductor chip and the wire and the junction between the second lead and the wire.

In the above optical semiconductor device, the holder part can have a frame shape, and the sealing part can be made of a soft resin.

According to another aspect of the presently disclosed subject matter, a method for manufacturing an optical semiconductor device can include: preparing a lead frame including a first lead part having a mount part for an optical semiconductor chip to be mounted on, a second lead part having a junction with a conductive wire being extended from the optical semiconductor chip, and a third lead part, the lead frame having a connection between the third lead part and the second lead part or a connection between the first lead part and the second lead part; molding a holder part for supporting both ends of the first lead part, the second lead part, and the third lead part; cutting the connection between the third lead part and the second lead part or the connection between the first lead part and the second lead part, within an inside space of the holder part of the lead frame; placing the optical semiconductor chip on the mount part; connecting the optical semiconductor chip and the junction by using the wire; and covering the first lead part, the second lead part, the third lead part, and the optical semiconductor chip within the inside space of the holder part with a sealing material.

The optical semiconductor device can include a first lead for the optical semiconductor chip to be mounted on and a second lead for the wire being extended from the optical semiconductor chip mounted on the first lead to be joined to. The one end of the second lead lies within the inside space of the holder part which supports the second lead at one location. Consequently, even if the other end, fixed to a mounting board or the like, is displaced by a thermal shock, the end lying within the inside space of the holder part will not make a vertical displacement but horizontal. This can reduce the possibility of a wire break even under a thermal shock and the like.

In particular, at least either one of the one end of the second lead and the one end of the third lead, lying within the inside space of the holder part, can have a bent shape. In addition to the foregoing effect, this configuration can further improve adhesion to the sealing material. This can avoid exfoliation and the production of bubbles ascribable to reflow soldering or a thermal shock. As compared to the case where the second lead and the third lead are separated with a predetermined gap d (≠0) therebetween as seen in a plan view, the provision of the bent shape can also increase the light reflecting surface and thereby improve the light output efficiency. The provision of the bent shape can also secure the path for injecting the sealing material.

In this configuration, the bent shape can be composed of two bends and an end parallel to the direction of extension of the first lead. In addition to the foregoing effects, this configuration can also stabilize the bent shape for stable product quality.

BRIEF DESCRIPTION OF THE DRAWINGS

These and other characteristics, features, and advantages of the presently disclosed subject matter will become clear from the following description with reference to the accompanying drawings, wherein.

DETAILED DESCRIPTION OF EXEMPLARY EMBODIMENTS

Hereinafter, the best mode for carrying out the presently disclosed subject matter will be described with reference to the drawings.

Figure 5A:
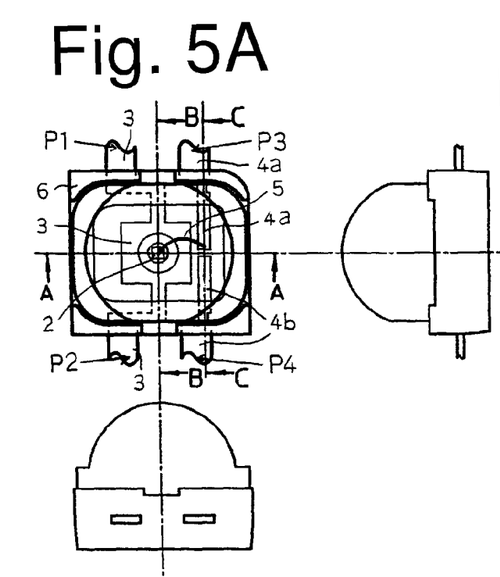
FIGS. 5A, 5B, 5C, and 5D are views showing an example of an optical semiconductor device according to a first exemplary embodiment of the presently disclosed subject matter, FIG. 5A being a trihedral top, front, and side drawing of the exemplary optical semiconductor device, FIG. 5B being a sectional view taken along line A-A of FIG. 5A, FIG. 5C being a sectional view taken along line B-B of FIG. 5A, and FIG. 5D being a sectional view taken along line C-C of FIG. 5A.
Figure 5B:
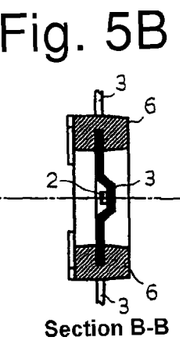
Figure 5C:
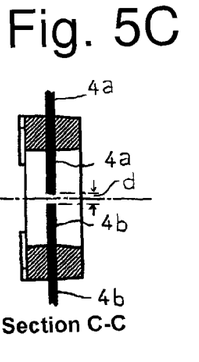
Figure 5D:
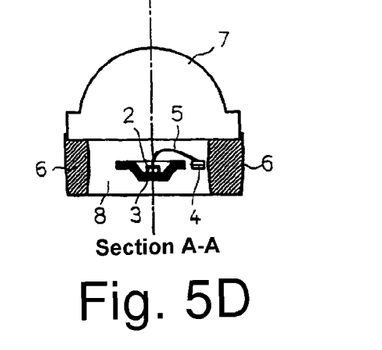

FIGS. 5A, 5B, 5C, and 5D are views showing an example of the configuration of an optical semiconductor device according to a first exemplary embodiment of the presently disclosed subject matter. FIG. 5A is a trihedral drawing of the optical semiconductor device. FIG. 5B is a sectional view taken along line A-A of FIG. 5A. FIG. 5C is a sectional view taken along line B-B of FIG. 5A. FIG. 5D is a sectional view taken along line C-C of FIG. 5A. In FIGS. 5A to 5D, parts that can be configured similarly or the same as parts in FIGS. 1A to 1D are designated by like reference numerals.

With reference to FIGS. 5A to 5D, the optical semiconductor device according to the first exemplary embodiment can include an optical semiconductor chip 2, a first lead 3 on which the optical semiconductor chip 2 is mounted, a second lead 4, a holder part 6, a lens part 7, and a light-transmitting sealing part 8. The optical semiconductor chip 2 may be, for example, an LED chip or a photodiode chip, etc. A wire (for example, gold wire) 5 extends from the optical semiconductor chip 2 mounted on the first lead 3, and is joined to the second lead 4. The holder part 6 can support the first lead 3 and the second lead 4 at two locations each. In this instance, the second lead 4 is separated into two lead pieces 4a and 4b with a predetermined gap d (≠0) therebetween within the inside space of the holder part 6. For example, the second lead 4 may be cut into the two lead pieces 4a and 4b to provide the predetermined gap d therebetween. That is, the ends of the two lead pieces 4a and 4b are separated at the predetermined gap d (≠0) from each other as seen in a plan or top view.

The first lead 3 has two terminals P1 and P2 which protrude outside and can be fixed by solder or the like. The second lead 4 also has two terminals P3 and P4 which protrude outside and can be fixed by solder or the like.

The holder part 6 can be configure to have no bottom portion at its center area, or has a so-called frame shape, or through hole configuration. Namely, the holder part 6 has a space penetrating inside thereof defined by inner walls of the holder part 6. As a result, the first lead 3 and the second lead 4 are in contact with and supported by the holder part 6 only at two locations each (they penetrate the holder part 6). More specifically, since the holder part 6 has no bottom face thereinside, the first lead 3 and the second lead 4 are not in contact with the holder part 6 but are free in the inside space thereof. In this instance, the holder part 6 can be made of polyphthalamide resin or the like, being formed by insert molding or the like.

The foregoing predetermined gap d by which the two lead pieces 4a and 4b are separated can have a dimension that keeps the two lead pieces 4a and 4b from each other without making their light reflecting surfaces too small in area. Specifically, the gap d can fall within the range of ½ to 2 times the chip width (the width of the optical semiconductor chip 2 as viewed along an optical axis of the chip 2).

In the first exemplary embodiment, the wire 5 that extends from the optical semiconductor chip 2 is connected to either one of the two lead pieces 4a and 4b (for example, 4a) which are separated from each other with the predetermined gap d between their ends. The two lead pieces 4a and 4b are not electrically connected with each other. Thus, between the two terminals P3 and P4, only the terminal of one lead piece (for example, 4a) to which the wire 5 is connected (joined) functions as an electrode (for example, P3). That is, the lead piece (for example, 4b) that the wire 5 is not connected (joined) to has no electrode function, but serves as a support member for stabilizing this device structurally. This lead piece (for example, 4b) can also be configured to function as a light reflecting surface for reflecting light that is emitted from the optical semiconductor chip 2.

Through the separation of the second lead 4 into the two lead pieces 4a and 4b, the first exemplary embodiment can provide the following effects:

(1) Since the second lead 4 is separated into the two lead pieces 4a and 4b, the second lead 4 (i.e., the lead pieces 4a and 4b) exhibits a smaller warp when undergoing a thermal shock. Accordingly, this can reduce the vertical displacement of the wire 5, thereby lowering the possibility of a break of the wire 5.

Figure 6:
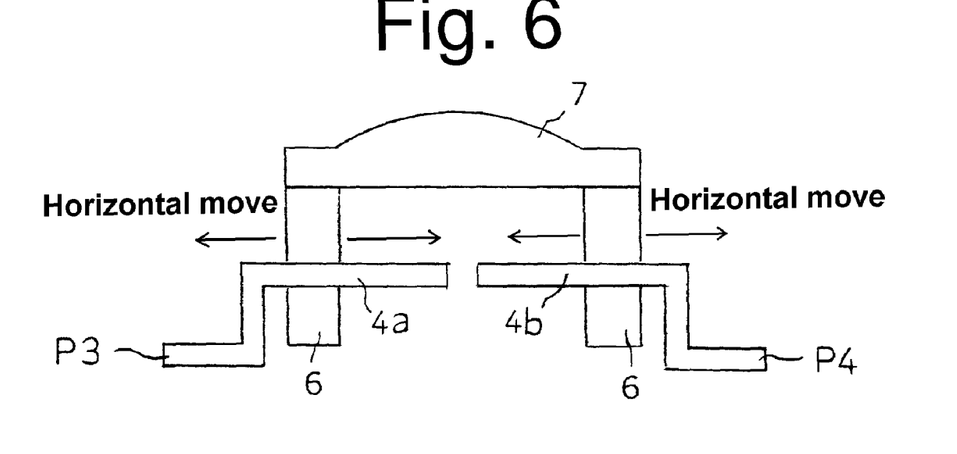
FIG. 6 is a diagram showing horizontal forces acting on two lead pieces of a second lead when the second lead is formed as the two separate lead pieces.

Note that while the separation of the second lead 4 into the two lead pieces 4a and 4b eases a vertically-warping stress as compared to the conventional case with an unseparated second lead, the two lead pieces 4a and 4b are subjected to horizontal stresses as shown in FIG. 6 instead so that the two lead pieces 4a and 4b move in horizontal directions. The junctions of the wire 5, however, are more susceptible to vertical forces than to horizontal forces. The reason why the junctions of the wire 5 are more susceptible to vertical forces than to horizontal forces is as follows: When the wire 5 is joined to the optical semiconductor chip 2 and the second lead 4, it is the junction with the optical semiconductor chip 2 that is the weakest. This is because the recrystallized portion formed at the junction between the wire 5 and the optical semiconductor chip 2 has mechanical properties weaker than those of not-recrystallized portions. For example, the optical semiconductor chip 2 and the wire 5 are connected by bonding a melted ball-shaped tip of the wire 5 to the electrode of the optical semiconductor chip 2, before the wire 5 is extended to press the other end against the second lead 4 and ultrasonic waves are applied for bonding. Unlike unmelted portions, the vicinity of the melted and bonded junction of the wire 5 therefore undergoes metal recrystallization, which weakens the mechanical properties of this recrystallized portion. While the horizontal forces act so as to exfoliate the junction with the second lead 4, the vertical forces act to stretch the recrystallized portion. That is, the vertical forces are likely to make the recrystallized portion thinner as shown in FIG. 4, ending up with a break of the wire 5. It is therefore considered that the wire 5 is less susceptible to and thus presents little or no problem with the horizontal stresses that occur when the second lead 4 is separated between the two lead pieces 4a and 4b, as compared to the vertical forces when the second lead 4 is not separated between the two lead pieces 4a and 4b.

Figure 7:
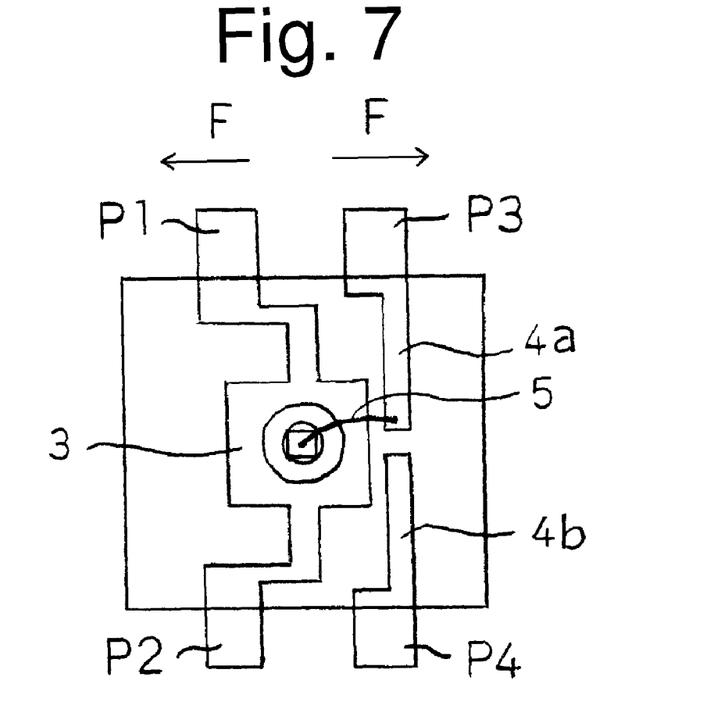
FIG. 7 is a diagram showing how the first-lead side and the second-lead side of the optical semiconductor device move in mutually separating directions (opposite directions) when reflow soldering is performed and the reflow heat thermally expands the holder part.

(2) During reflow soldering, the reflow heat tends to cause thermal expansion of the holder part 6 through the leads. By this holder part 6, the optical semiconductor device is pulled and moved to the side of the first lead 3 and to the side of the second lead 4 apart from each other (in opposite directions) as shown by the arrows F in FIG. 7, so as to stretch the wire 5 in the horizontal directions. The separation of the second lead 4 into the two lead pieces 4a and 4b isolates the expanding portions of the holder part 6 about the respective contact surfaces with the lead. Consequently, as compared to conventional optical semiconductor devices such as shown in FIGS. 1A to 1D, the forces to stretch the wire 5 horizontally as shown by the arrows F are relaxed to approximately ½. This reduces the possibility of a break of the wire 5 further.

Figure 8:
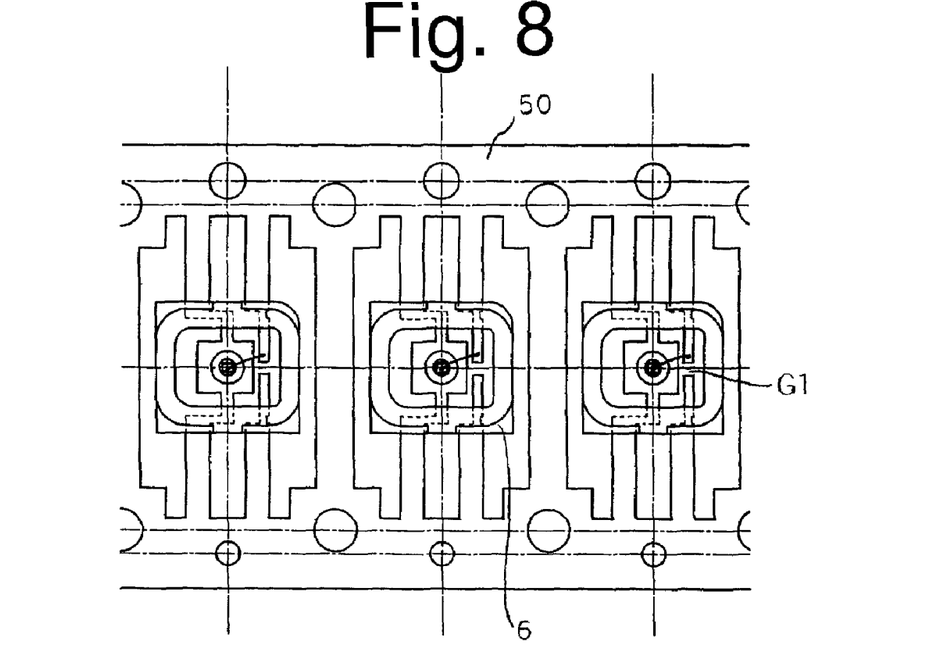
FIG. 8 is a diagram showing a state in the process of manufacturing products (optical semiconductor devices)

(3) Products in the process of manufacturing can be inspected by cutting the lead frame in one position for each optical semiconductor device. This can provide the advantage of stable product quality. FIG. 8 shows products (optical semiconductor devices) in the process of manufacturing, i.e., where the holder parts 6 are in the state of being attached to a lead frame 50. When inspecting each product at this point of the manufacturing process, the second lead must be used as a testing electrode. In other words, the second lead must be electrically separated from the lead frame 50.

Figure 9:
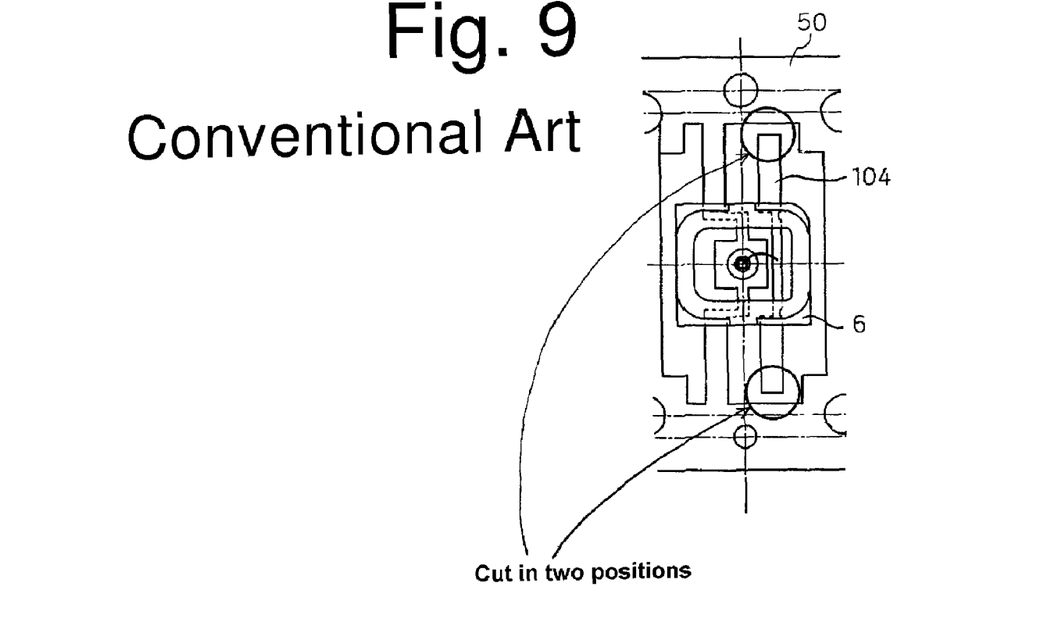
FIG. 9 is a diagram for explaining a process for manufacturing a conventional optical semiconductor device.

As shown in FIG. 1, the conventional second lead 104 is a single solid member. To separate this second lead 104 from the lead frame 50 electrically therefore requires that the lead frame 50 be cut in two positions as shown in FIG. 9. When the lead frame 50 is cut in two positions, it follows that the product is supported by the lead frame 50 only at two locations. In the subsequent manufacturing steps, this conventional supporting structure can cause instabilities in product quality, including erroneous lens mounting due to lead warpage, misalignment of the optical axes, insufficient resin injection, etc.

Figure 10:
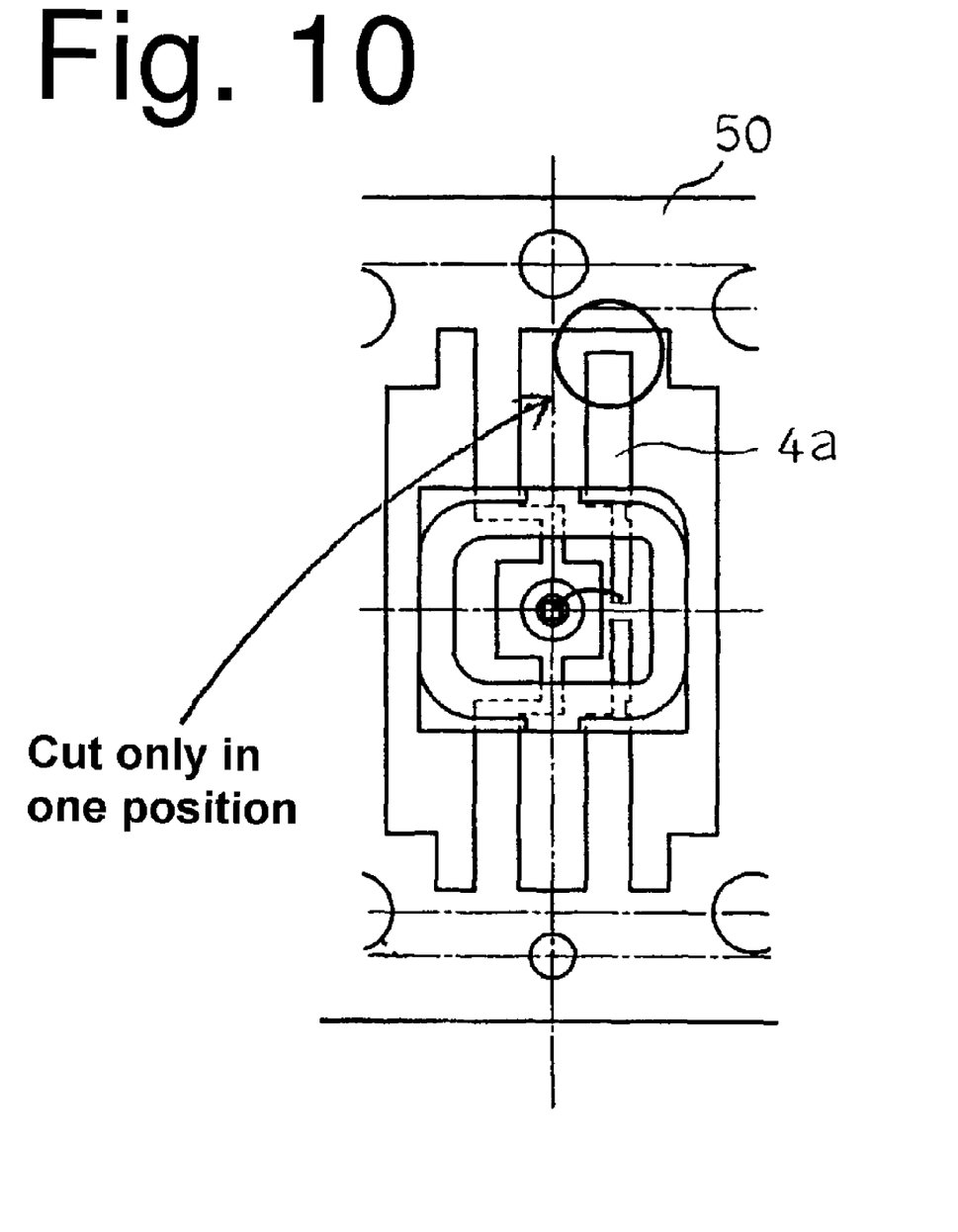
FIG. 10 is a diagram for explaining a process of manufacturing an exemplary optical semiconductor device made in accordance with principles of the presently disclosed subject matter.

In contrast, the second lead 4 of this embodiment can be separated into the two lead pieces 4a and 4b, and the wire 5 is joined to only one of the two lead pieces 4a and 4b (for example, 4a). To electrically separate the lead piece 4a from the lead frame 50 therefore requires only that the lead frame 50 be cut in one position (only at the side of the lead piece 4a) as shown in FIG. 10. Since the lead frame 50 is cut only in one position, the product is supported by the lead frame 50 at three locations. This provides the advantage of higher stability in subsequent manufacturing steps.

Figure 11A:
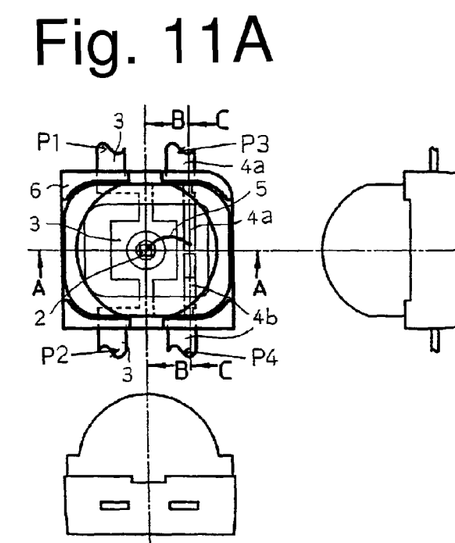
FIGS. 11A, 11B, 11C, and 11D are views showing an example of a configuration of an optical semiconductor device according to a second exemplary embodiment of the presently disclosed subject matter, FIG. 11A being a trihedral top, front, and side drawing of the optical semiconductor device, FIG. 11B being a sectional view taken along line A-A of FIG. 11A, FIG. 11C being a sectional view taken along line B-B of FIG. 11A, and FIG. 11D being a sectional view taken along line C-C of FIG. 11A.
Figure 11B:
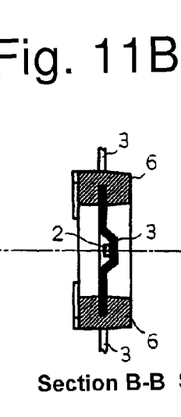
Figure 11C:
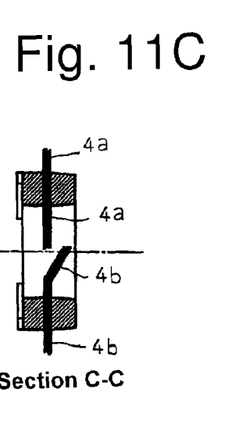
Figure 11D:
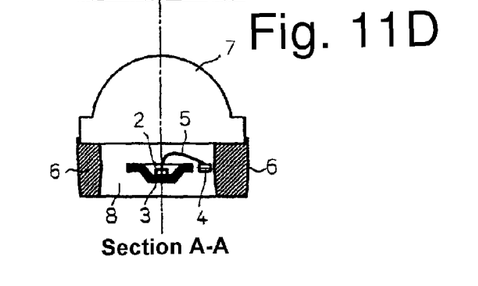

FIGS. 11A, 11B, 11C, and 11D are views showing an example of a configuration of an optical semiconductor device according to a second exemplary embodiment of the presently disclosed subject matter. FIG. 11A is a trihedral drawing of the optical semiconductor device. FIG. 11B is a sectional view taken along line A-A of FIG. 11A. FIG. 11C is a sectional view taken along line B-B of FIG. 11A. FIG. 11D is a sectional view taken along line C-C of FIG. 11A. In FIGS. 11A to 11D, the same or similar parts and corresponding parts to those of FIGS. 1A to 1D and 5A to 5D are designated by like reference numerals.

With reference to FIGS. 11A to 11D, the optical semiconductor device according to the second exemplary embodiment can include an optical semiconductor chip 2, a first lead 3 on which the optical semiconductor chip 2 is mounted, a second lead 4, a holder part 6, a lens part 7, and a light-transmitting sealing part 8. The optical semiconductor chip 2 may be an LED chip or a photodiode chip, for example. A wire 5 (such as gold wire) extends from the optical semiconductor chip 2 mounted on the first lead 3, and is joined to the second lead 4. The holder part 6 can support the first lead 3 and the second lead 4 at two locations each. In this instance, the second lead 4 is separated into two lead pieces 4a and 4b within the inside space of the holder part 6. For example, the second lead 4 may be cut into two separate lead pieces 4a and 4b. In addition, either one of the two lead pieces 4a and 4b (for example, 4b) can be bent in a direction towards an optical axis of the device. In the second exemplary embodiment, the two separate lead pieces 4a and 4b need not be formed with a predetermined gap d therebetween as seen in a plan view as in the first exemplary embodiment, since either one (or both) of the lead pieces can be bent afterward. In other words, the predetermined gap d as seen in the plan view may be zero.

With the bent shape of the lead piece 4a or 4b (for example, 4b), this second exemplary embodiment can provide the following effects in addition to the foregoing effects (1), (2), and (3) of the first exemplary embodiment:

(4) The improved adhesiveness between the bent lead piece 4b and the sealing part (sealing resin) 8 can preclude exfoliation and the production of bubbles during reflow soldering or when undergoing a thermal shock.

(5) The application of the bending can secure a three-dimensional path for injecting resin or the like when forming the sealing part 8.

Figure 12:
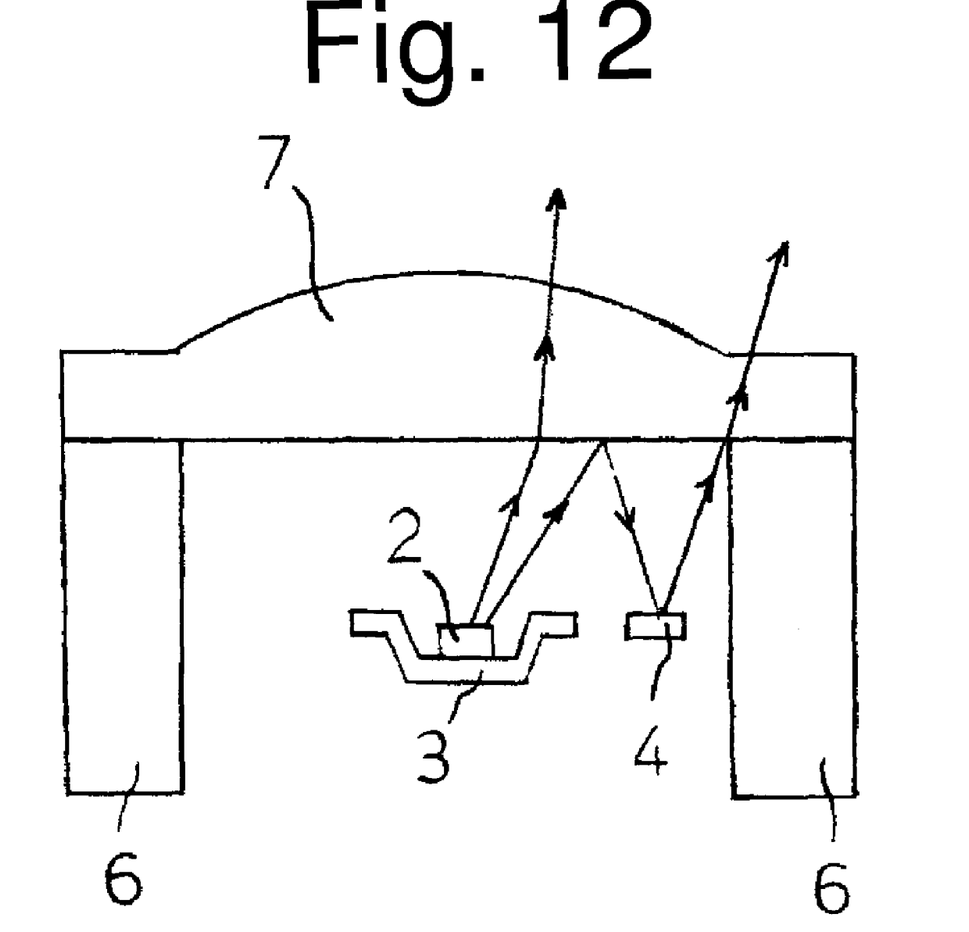
FIG. 12 is a diagram for showing the function of a light reflecting surface on the second lead for reflecting light that is emitted from the optical semiconductor chip.

(6) If the two lead pieces 4a and 4b are bent in shape, it is possible to improve the light output efficiency as compared to the case of creating a predetermined gap d ($\neq 0$) as seen in a plan view. More specifically, the second lead 4 can also function as a light reflecting surface for reflecting the light that is emitted from the optical semiconductor chip 2 as shown in FIG. 12. Unlike the separation with a predetermined gap d ($\neq 0$) as seen in the plan view as in the first exemplary embodiment (where the separation with the predetermined gap d ($\neq 0$) makes the light reflecting surface smaller as much as the predetermined gap d ($\neq 0$)), the zero-gap separation (such as cutting) as seen in the plan view and the bending can increase the light reflecting surface with respect to the light output surface.

(7) Since the second lead 4 is cut into the two separate lead pieces 4a and 4b after the formation of the holder part 6, the holder part 6 can be formed with improved molding quality. To be more specific, products of smaller dimensions (for example, having a horizontal and vertical size of 1 cm×1 cm or less) are difficult to mold if the two lead pieces 4a and 4b are separated in advance. The separated leads are easier to move than are unseparated leads, and thus cause such problems as the biting of the mold into the leads. The bending also has the advantage of no chipping since zero-gap cutting is possible. If the molded lead were cut to make a gap, an additional step of removing chippings may be required. In view of the durability of the mold, however, it is difficult for products of smaller dimensions to employ a mold structure for removing chippings.

Figure 13A:
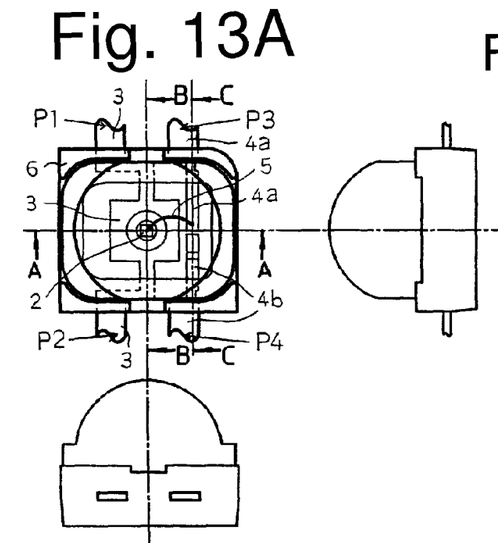
FIGS. 13A, 13B, 13C, and 13D are views showing another example of a configuration of an optical semiconductor device according to a third exemplary embodiment of the presently disclosed subject matter, FIG. 13A being a trihedral top, front and side drawing of the optical semiconductor device, FIG. 13B being a sectional view taken along line A-A of FIG. 13A, FIG. 13C being a sectional view taken along line B-B of FIG. 13A, and FIG. 13D being a sectional view taken along line C-C of FIG. 13A.
Figure 13B:
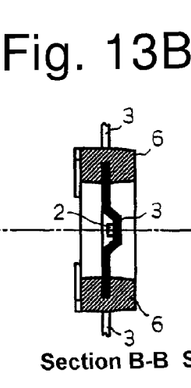
Figure 13C:
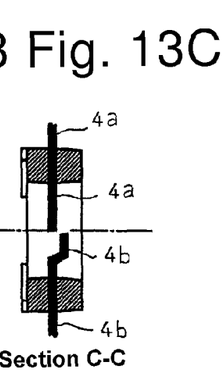
Figure 13D:
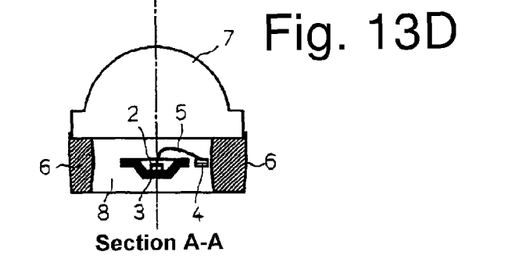

FIGS. 13A, 13B, 13C, and 13D are views showing an example of a configuration of an optical semiconductor device according to a third exemplary embodiment of the presently disclosed subject matter. FIG. 13A is a trihedral drawing of the optical semiconductor device. FIG. 13B is a sectional view taken along line A-A of FIG. 13A. FIG. 13C is a sectional view taken along line B-B of FIG. 13A. FIG. 13D is a sectional view taken along line C-C of FIG. 13A. In FIGS. 13A to 13D, the same or similar parts and corresponding parts to those of FIGS. 1A to 1D, 5A to 5D, and 11A to 11D are designated by like reference numerals.

With reference to FIGS. 13A to 13D, the optical semiconductor device according to the third exemplary embodiment can include an optical semiconductor chip 2, a first lead 3 on which the optical semiconductor chip 2 is mounted, a second lead 4, a holder part 6, a lens part 7, and a light-transmitting sealing part 8. The optical semiconductor chip 2 may be, for example, an LED chip or a photodiode chip. A wire 5 (such as gold wire) extends from the optical semiconductor chip 2 mounted on the first lead 3, and is joined to the second lead 4. The holder part 6 can support the first lead 3 and the second lead 4 at two locations each. In this instance, the second lead 4 is separated into two lead pieces 4a and 4b within the inside space of the holder part 6. For example, the second lead 4 is cut into the two separate lead pieces 4a and 4b. In addition, either one of the two lead pieces 4a and 4b (for example, 4b) is bent at two positions in mutually opposite directions (along the direction of the optical axis). In the third exemplary embodiment, the two separate lead pieces 4a and 4b need not be formed with a predetermined gap d therebetween as seen in a plan view as in the first exemplary embodiment, since either one of the lead pieces is bent at two positions in mutually opposite directions afterward. In other words, the predetermined gap d as seen in the plan view may be zero. Such bending of the lead piece at two positions in mutually opposite directions according to the third exemplary embodiment will be referred to as "Z-shaped bending."

With the Z-shaped bending of the lead piece, this third exemplary embodiment can provide the effect of stable product quality, in addition to the foregoing effects (1), (2), (3), (4), (5), (6), and (7) of the first and second exemplary embodiments. That is, while the simple bending as in the second exemplary embodiment may create variations in the bending angle, the Z-shaped bending according to the third exemplary embodiment can stabilize the shape of the bending for stable product quality.

It should now be noted that, in the second and third exemplary embodiments, the wire 5 may be joined to either the flat lead piece (4a, in the examples as shown in FIGS. 11D and 13D) or the bent lead piece (4b, in the examples as shown in FIGS. 11D and 13D). The flat lead piece may provide the following certain additional features or characteristics.

That is, if the wire 5 is connected (joined) to the curved surface of the bent lead piece, the wire strength may vary since the curved surface has large variations in surface precision. The increased wire length can also increase the possibilities of such problems as wire sagging during manufacturing steps. Then, it may be desired in certain applications to join the wire 5 to the flat lead piece (4a, in the examples as shown in FIGS. 11D and 13D).

Moreover, in the second and third exemplary embodiments, the direction of bending (in the third exemplary embodiment, the direction of bending of the entire Z shape) may alternatively be toward the side where the optical semiconductor chip 2 is mounted on the first lead 3 (i.e., toward the lens part 7). The direction of bending, however, as shown, is toward the side opposite from where the optical semiconductor chip 2 is mounted (i.e., opposite from the lens part 7). There may be some issues that arise that must be overcome if using the alternate bending direction.

To be more specific, if the bent lead piece protrudes toward the wire, it can cause the problem of touching the wire. In addition, if the lead piece is bent toward the lens part 7, the portion curved toward the lens part 7 may sometimes have adverse effects on the optical characteristics of the optical semiconductor device depending on the directional characteristics of the optical semiconductor device. Namely, a bias on the directional characteristics and a drop in strength due to hindered incidence to the lens may occur. Furthermore, a bias on the directional characteristics and a drop in strength due to scattering of light may also occur.

From the foregoing, it is shown that the direction of bending in the second and third exemplary embodiments (the direction of bending of the entire Z shape in the third exemplary embodiment) in many cases should be toward the side opposite from where the optical semiconductor chip 2 is mounted (i.e., opposite from the lens part 7).

In the foregoing first, second, and third exemplary embodiments, the first lead 3 may also be cut for the purpose of precluding distortion of the wire 5. Nevertheless, when the first lead 3 has an uncut form, the lead 3 can improve heat dissipation characteristics, and can thus provide rather advantageous benefits for certain applications of the device. It is therefore often desirable not to cut the first lead 3.

In the examples of the foregoing first, second, and third exemplary embodiments, the holder part 6 has no bottom face at its center area. The presently disclosed subject matter is also applicable, however, to the case where the holder part 6 has a bottom face thereinside. Even in this case, the separation of the second lead 4 into the two lead pieces 4a and 4b, the formation and bending of the two separated lead pieces 4a and 4b, or the Z-shaped bending of the same can lower the possibility of a break of the wire 5 when undergoing a thermal shock or the like. In particular, when the holder part 6 has a bottom surface forming a type of well, the thermal expansion of the holder part 6 due to reflow heat has a higher impact. This makes the foregoing effect (2) from the configuration of the presently disclosed subject matter more beneficial in particular.

The optical semiconductor devices according to the first, second, and third exemplary embodiments can be manufactured, for example, as follows:

Initially, as shown in FIG. 8, the holder part 6 is formed on the lead frame 50 by molding, using a predetermined mold. The area of the lead frame 50 that makes the second lead 4 is then cut with a gap in the first exemplary embodiment, cut and bent in the second exemplary embodiment, or cut and bent into a Z shape in the third exemplary embodiment. FIG. 8 shows the state after the second lead 4 is cut in the area designated by the reference symbol G1. Before this cutting, the area designated by the reference symbol G1 in FIG. 8 is a solid member such as shown in FIG. 9.

In this instance, the lead frame 50 can include: a first lead part having a mount part for an optical semiconductor chip to be mounted on (corresponding to the first lead 3 of the product); a second lead part having a junction with a wire that extends from the optical semiconductor chip (corresponding to the lead piece 4a of the product); and a third lead part (corresponding to the lead piece 4b of the product). The lead frame 50 also has a connection between the third lead part and the second lead part. In other words, the third lead part and the second lead part are connected (integrated) at the beginning. For the purpose of manufacturing a plurality of optical semiconductor devices, units are provided which each include the first lead part, the second lead part, and the third lead part formed in succession.

Subsequently, the optical semiconductor chip 2 is mounted on the part of the lead frame 50 that makes the first lead 3. The optical semiconductor chip 2 and the second lead 4 are connected with a wire 5.

When inspecting the product, the lead frame 50 is cut in one position outside the holder part 6 as shown in FIG. 10. More specifically, the area of the lead frame 50 that makes the electrode terminal of the second lead 4 is cut to form the lead piece 4a. Then, a predetermined voltage is applied to between the lead piece 4a, or the electrode terminal, and the lead frame 50, whereby product inspection can be performed which can include testing whether the optical semiconductor chip 2 activates or not, etc.

If the device passes the product inspection, an adhesive is applied to the holder part 6, which is then placed on the lens part 7 and heated to cure the adhesive. Next, the article is turned over, and a light-transmitting sealing resin is injected into the inside space of the holder part 6 and heated to cure into the sealing part 8. The first lead 3 and the lead piece 4b are cut and bent outside the holder part 6 of the lead frame 50, thereby completing the product.

The foregoing product inspection step may be performed arbitrarily. When omitting the inspection step, the second lead 4 outside the holder part 6 may be cut after the formation of the sealing part 8.

The foregoing second and third exemplary embodiments contemplate cases in which either one of the two lead pieces 4a and 4b (for example, 4b) is bent. However, both of the two lead pieces 4a and 4b may be bent. Nevertheless, since the wire 5 is desirably joined to a flat area as described above, in many applications the bend is only in one of the two lead pieces 4a and 4b (for example, 4b).

The foregoing first, second, and third exemplary embodiments have also dealt with the cases where the two lead pieces 4a and 4b are formed by cutting the second lead 4. In this instance, the two lead pieces 4a and 4b are arranged so that their ends are opposed to each other (aligned on a straight line). Nevertheless, the two separate lead pieces 4a and 4b may be prepared in advance and arranged in respective predetermined positions, instead of cutting a single member. In this case, the two lead pieces 4a and 4b may be either aligned on a straight line or arranged off a straight line (unevenly) if necessary or desired (so that their ends are not opposed to each other).

Considering that the two lead pieces 4a and 4b may be prepared in advance as respective separate members instead of cutting a single member as described above, the presently disclosed subject matter shall refer to the member corresponding to the lead piece 4a as a second lead and the member corresponding to the lead piece 4b as a third lead.

Under such terminological definitions, the first lead 3 is led out of a first side and a second side, opposite from the first side, of the holder part 6 which is formed in a frame shape with a rectangular outline (or square, etc.). The first lead 3 has two terminals P1 and P2. The second lead 4a is led out of either one of the foregoing two sides. The third lead 4b is led out of the other of the two sides. The second and third leads 4a and 4b have terminals P3 and P4, respectively. In other words, one end (terminal P1) of the first lead 3 and one end (terminal P3) of the second lead 4a are led out of the same side of the holder part 6. The other end (terminal P2) of the first lead 3 and one end (terminal P4) of the third lead 4b are led out of the same side of the holder part 6.

The terminals P1 and P2 can be arranged symmetrically about the center of the holder part 6 as shown in sections B-B of FIGS. 5C, 11C, and 13C. The terminals P3 and P4 can be arranged symmetrically about the center of the holder part 6 as shown in sections C-C of FIGS. 5D, 11D, and 13D. The positions where the terminals P1 and P4 are led out and where the terminals P2 and P3 are led out can be symmetrical about the center location of the holder part 6. This lead-terminal arrangement makes it possible to create an optical semiconductor device that does not have certain problems, such as tilted mounting.

As shown in FIG. 2, the terminals P1, P2, P3, and P4 are led out of the holder part 6 and bent to the bottom side, and then bent outward from the holder part 6 to form mounting parts.

The second lead 4a and the third lead 4b each have one end within the inside space of the holder part 6. In the examples of the first, second, and third exemplary embodiments, the ends of the second lead 4a and the third lead 4b lying within the inside space of the holder part 6 are opposed to each other and covered with the material of the sealing part 8.

The sealing part 8 is made of a light-transmitting resin or the like. Soft silicone resins are suitably used. The optical semiconductor chip 2 is protected by the flexibility of the soft resin.

The holder part 6 is made of polyphthalamide resin or the like, being formed by insert molding or the like. The holder part 6 can have no bottom portion to help prevent a displacement or a break of the wire 5 when heated through the leads during mounting.

Since the sealing part 8 of soft resin is combined with the holder part 6 having no bottom portion, the optical semiconductor chip 2 undergoes little or no pressure even if the soft resin expands. This makes it possible to constitute an optical semiconductor device of high reliability.

The lead terminals led out of the holder part 6 are not limited to the bending shape of the second and third exemplary embodiments. The first lead 3, the second lead 4a, and the third lead 4b led out of the holder part 6 may be bent to the bottom side and then toward the center of the holder part 6, for example.

Figure 14:
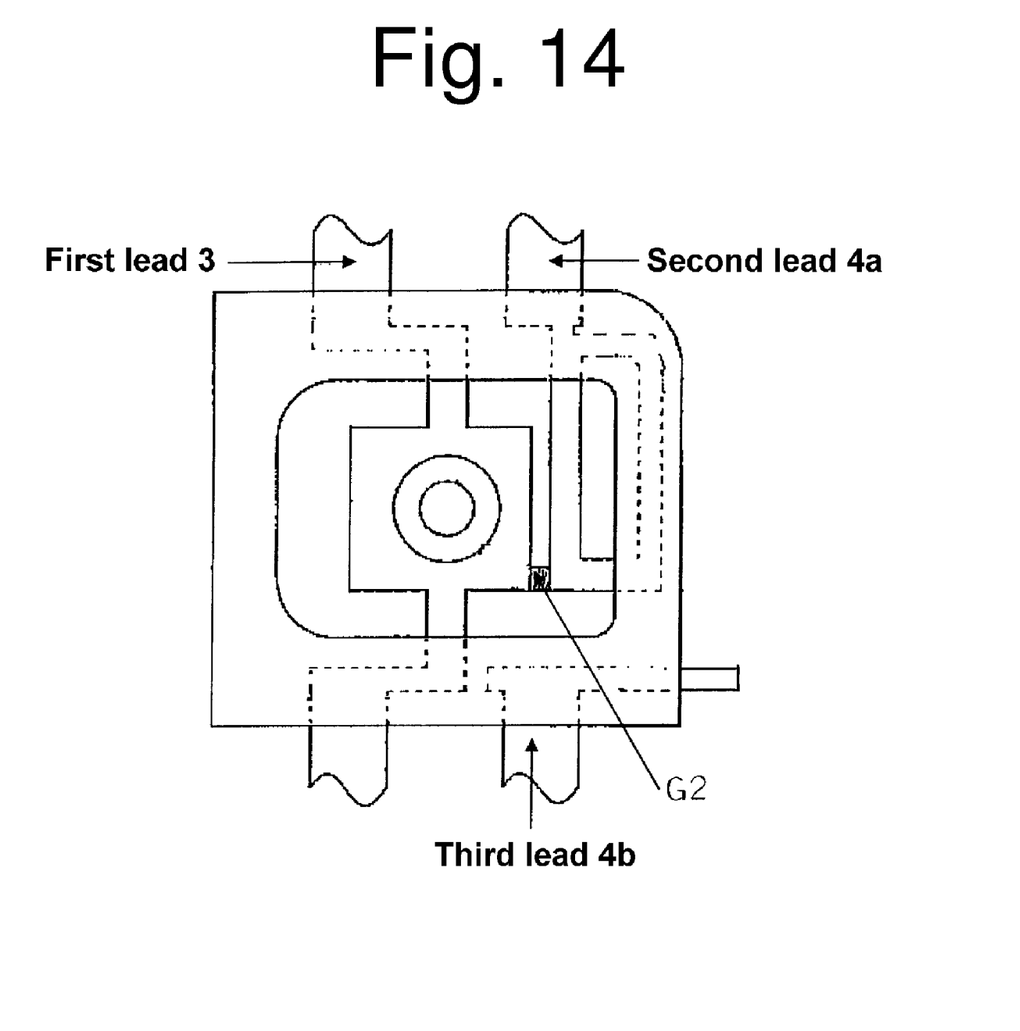
FIG. 14 is a diagram showing an example of a configuration of an optical semiconductor device according to another exemplary embodiment of the presently disclosed subject matter.

The foregoing first, second, and third exemplary embodiments have dealt with the cases where one of the ends of the third lead 4b lies within the inside space of the holder part 6. Nevertheless, the one end of the third lead 4b is not necessarily positioned within the inside space of the holder part 6. Suppose, as shown in FIG. 14, that one of the ends of the third lead 4b to be used as a mounting terminal is led out of the side of the holder part 6 where one of the ends of the first lead 3 is led out. Then, the other end of the third lead 4b may be led out of the adjoining side of the holder part 6. In the manufacturing process, a connection G2, if formed between the first lead 3 and the second lead 4a within the inside space of the holder part 6, may be cut and even bent after the formation of the holder part 6.

In the foregoing exemplary embodiments, the lens part 7 and the sealing part 8 are formed as separate members. However, these parts may be formed integrally. For example, the device that has passed the foregoing product inspection may be placed in a predetermined mold, followed by injection of a light-transmitting sealing resin to mold the lens part 7. This forms the lens part 7 and the sealing part 8 integrally from the same light-transmitting sealing resin.

The foregoing exemplary embodiments have dealt with the cases where an LED chip or a photodiode chip is used as the optical semiconductor chip 2, with a gold wire as the wire 5 and soft resin as the sealing part 8. This is not restrictive, however. Note that the wire 5 should be electrically conductive. The lens may be formed arbitrarily. The holder part 6 of frame shape is not limited to the rectangular configuration, and can be oval, triangular, asymmetrical, or specifically designed for a particular application.

As described previously, the optical semiconductor chip 2 and the wire 5 can be connected by bonding a melted ball-shaped tip of the wire 5 to the electrode of the optical semiconductor chip 2, before the wire 5 is extended to press the other end against the second lead 4a and ultrasonic waves are applied for bonding. Unlike unmelted portions, the vicinity of the melted and bonded junction of the wire 5 therefore undergoes metal recrystallization. The formation of this recrystallized portion can increase the rising angle of the wire 5 as compared to the cases where the recrystallized portion is not formed. The increased rising angle is particularly essential when the optical semiconductor chip 2 is arranged on the bottom of the recess as in the foregoing exemplary embodiments, and when high-density packaging is required. The optical semiconductor chip 2 is placed on the bottom of the recess that is formed in the first lead 3, and the recess walls are utilized as reflecting surfaces.

As has been described, an exemplary optical semiconductor device can include: the optical semiconductor chip 2; the wire 5 extending from the optical semiconductor chip 2; the holder part 6 having an inside space for accommodating the optical semiconductor chip 2; the first lead 3 having a mount part for the optical semiconductor chip 2 to be mounted on, being led out of two sides of the holder part 6 including a first side and a second side opposite from the first side; the second lead 4a having a junction with the conductive wire 5 extending from the optical semiconductor chip 2, being led out of the first side of the holder part 6 at a location different from where the first lead 3 is led out; the third lead 4d being led out of the second side of the holder part 6 at a location different from where the first lead 3 is led out; and the sealing part 8 for covering the first lead 3, the second lead 4a, the third lead 4b, and the optical semiconductor chip 2 within the inside space of the holder part 6.

In this instance, one of the ends of the third lead 4b may be opposed to one of the ends of the second lead 4a, lying within the inside space of the holder part 6 (for example, the third lead 4b and the second lead 4a are aligned on a straight line).

Here, at least either one of the one end of the second lead 4a and the one end of the third lead 4b, lying within the inside space of the holder part 6, can have a bent shape.

This bent shape can be composed of two bends and an end parallel to the direction of extension (the direction of leading) of the first lead 3.

In the optical semiconductor device, the first lead 3, the second lead 4a, and the third lead 4b can extend (be led out) from the holder part 6 so as to be in parallel with each other.

In the optical semiconductor device, a recrystallized portion can be formed in at least either one of the junction between the optical semiconductor chip 2 and the wire 5 and the junction between the second lead 4a and the wire 5.

In the optical semiconductor device, the holder part 6 can have a frame shape. The sealing part 8 can be made of a soft resin.

Examples of optical semiconductor devices made in accordance with principles of the presently disclosed subject matter can be manufactured as follows:

That is, the optical semiconductor devices shown in FIGS. 5A to 5D, 11A to 11D, and 13A to 13D can be manufactured by a method for manufacturing an optical semiconductor device, including: preparing the lead frame 50 including a first lead part 3 having a mount part for the optical semiconductor chip 2 to be mounted on, a second lead part 4a having a junction with the conductive wire 5 extending from the optical semiconductor chip 2, and a third lead part 4b, the lead frame 50 having a connection between the third lead part 4b and the second lead part 4a (so that the third lead part 4b and the second lead part 4a are connected to each other); molding the holder part 6 for supporting both ends of the first lead part 3, the second lead part 4a, and the third lead part 4b; cutting the connection between the third lead part 4b and the second lead part 4a within the inside space of the holder part 6 of the lead frame 50; placing the optical semiconductor chip 2 on the mount area; connecting the optical semiconductor chip 2 and the junction of the second lead part 4a by using the conductive wire 5; and covering the first lead part 3, the second lead part 4a, the third lead part 4b, and the optical semiconductor chip 2 within the inside space of the holder part 6 with a sealing material.

Moreover, the optical semiconductor device shown in FIG. 14 can be manufactured by a method of manufacturing an optical semiconductor device, including: preparing the lead frame 50 including a first lead part 3 having a mount part for the optical semiconductor chip 2 to be mounted on, a second lead part 4a having a junction with the conductive wire 5 extending from the optical semiconductor chip 2, and a third lead part 4b, the lead frame 50 having a connection between the first lead part 3 and the second lead part 4a (so that the first lead part 3 and the second lead part 4a are connected to or integral with each other); molding the holder part 6 for supporting both ends of the first lead part 3, the second lead part 4a, and the third lead part 4b; cutting the connection between the first lead part 3 and the second lead part 4a within the inside space of the holder part 6 of the lead frame 50; placing the optical semiconductor chip 2 on the mount part; connecting the optical semiconductor chip 2 and the junction of the second lead part 4a by using the conductive wire 5; and covering the first lead part 3, the second lead part 4a, the third lead part 4b, and the optical semiconductor chip 2 within the inside space of the holder part 6 with a sealing material.

It should be noted that a gap exists between the second lead 4a and third lead 4b in each of the above-described embodiments. For example, the gap or space between the leads can be seen from the top view in FIG. 5A, while the gap or space between the leads can be seen in the side view in FIGS. 11C and 13C. In other words, the gap or space can be a vertical, horizontal, or other spacing or gap between the leads.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents. All related art references described above are hereby incorporated in their entirety by reference.

What is claimed is:

1. An optical semiconductor device comprising:
   an optical semiconductor chip;
   a wire extending from the optical semiconductor chip;
   a holder part having a frame shape and an inside space configured to accommodate the optical semiconductor chip;
   a sealing part configured to cover the optical semiconductor chip within the inside space of the holder part, the sealing part being made of a soft resin;
   a first lead having a mount part configured for the optical semiconductor chip to be mounted on, the first lead extending out of two sides of the holder part including a first side and a second side opposite from the first side;
   a second lead having a junction with the wire extending from the optical semiconductor chip, the second lead having one end extending out of the first side of the holder part at a location different from where the first lead extends out, and the other end extending in the inside space of the holder part so as to be covered with the sealing part; and
   a third lead having one end extending out of the second side of the holder part at a location different from where the first lead extends out and the other end extending in the inside space of the holder part so as to be covered with the sealing part, wherein
   the third lead is entirely separated from and not in electrically conductive contact with the first lead and the second lead, wherein
   the other end of the third lead is arranged to be opposed to the other end of the second lead positioned within the inside space of the holder part,
   at least one of the other end of the second lead and the other end of the third lead, lying within the inside space of the holder part, has a bent shape,
   the bent shape is composed of two bends and an end parallel to a direction of extension of the first lead, and
   the two bends include a bend directed approximately in an optical axis direction and a parallel bend to the direction of extension of the first lead.

2. The optical semiconductor device according to claim 1, wherein the first lead, the second lead, and the third lead extend from the holder part so as to be in parallel with each other.

3. A method for manufacturing an optical semiconductor device, comprising:
   preparing a lead frame including a first lead part having a mount part for an optical semiconductor chip to be mounted on, a second lead part having a junction part for connection with a conductive wire extending from the optical semiconductor chip, and a third lead part, the lead frame having at least one of a connection part electrically connecting the third lead part and the second lead part and a connection part electrically connecting the first lead part and the second lead part;

molding a holder part having a frame shape and supporting ends of the first lead part, one end of the second lead part, and one end of the third lead part;

cutting at least one of the connection part between the third lead part and the second lead part, and the connection part between the first lead part and the second lead part, within an inside space of the holder part of the lead frame to separate the first lead part, the second lead part and the third lead part;

placing the optical semiconductor chip on the mount part;

connecting the optical semiconductor chip and the junction part by the wire; and covering the first lead part, the one end of the second lead part extending in the inside space of the holder part, the one end of the third lead part extending in the inside space of the holder part, and the optical semiconductor chip within the inside space of the holder part with a sealing material made of a soft resin.

4. An optical semiconductor device comprising:

an optical semiconductor chip;

a wire extending from the optical semiconductor chip;

a holder part having a frame shape and inner walls defining an inside space configured to accommodate the optical semiconductor chip;

a sealing part configured to cover the optical semiconductor chip within the inside space of the holder part, the sealing part being made of a soft resin;

a first lead having a mount part with the optical semiconductor chip mounted on the mount part, the first lead extending out of two sides of the holder part;

a second lead connected with the wire extending from the optical semiconductor chip, the second lead having one end extending out of a first side of the holder part and the other end extending in the inside space of the holder part so as to be covered with the sealing part; and a third lead having one end extending out of a second side of the holder part at a location different from where the second lead extends out of the holder part and the other end extending in the inside space of the holder part so as to be covered with the sealing part, wherein the third lead is entirely separate from and not in electrically conductive contact with the first lead and the second lead, the other end of the third lead is arranged to be opposed to the other end of the second lead positioned within the inside space of the holder part, at least one of the other end of the second lead and the other end of the third lead, lying within the inside space of the holder part, has a bent shape, the bent shape is composed of two bends and an end parallel to a direction of extension of the first lead, and the two bends include a bend directed approximately in an optical axis direction and a parallel bend to the direction of extension of the first lead.

* * * * *